(12) United States Patent
Kim et al.

(10) Patent No.: US 7,327,609 B2
(45) Date of Patent: Feb. 5, 2008

(54) METHODS OF PROGRAM-VERIFYING A MULTI-BIT NONVOLATILE MEMORY DEVICE AND CIRCUIT THEREOF

(75) Inventors: Bo-Geun Kim, Gyeonggi-do (KR); Seung-Keun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 11/241,291

(22) Filed: Sep. 30, 2005

(65) Prior Publication Data
US 2006/0126391 A1    Jun. 15, 2006

(30) Foreign Application Priority Data
Dec. 9, 2004   (KR) .............................. 2004-103528

(51) Int. Cl.
*G11C 16/34* (2006.01)
(52) U.S. Cl. ...................... 365/185.22; 365/185.21; 365/185.2; 365/185.03; 365/185.29
(58) Field of Classification Search .......... 365/185.03, 365/185.22, 185.21, 185.2, 185.18, 185.33, 365/185.29, 185.09
See application file for complete search history.

(56) References Cited

U.S. PATENT DOCUMENTS 5,172,338 A * 12/1992 Mehrotra et al. ...... 365/185.03

6,414,876 B1 * 7/2002 Harari et al. .......... 365/185.22

FOREIGN PATENT DOCUMENTS

| JP | 2001-014873 | 1/2001 |
|----|-------------|--------|
| JP | 2001-084779 | 3/2001 |
| KR | 1020040010231 | 1/2004 |
| KR | 10-2004-0071293 | 8/2004 |
| KR | 10-2004-7010522 | 8/2004 |

* cited by examiner

*Primary Examiner*—Andrew Q. Tran
(74) *Attorney, Agent, or Firm*—Myers Bigel Sibley & Sajovec P.A.

(57) ABSTRACT

Methods of verifying a program state may be provided for a non-volatile memory device including a multi-bit memory cell transistor providing more than two different program states. More particularly, the multi-bit memory cell transistor may be programmed from a first program state to a second program state, and a reference memory cell corresponding to the second program state may be selected. After programming the multi-bit memory cell transistor to the second program state and after selecting the reference memory cell corresponding to the second program state, a current flowing through the multi-bit memory cell transistor programmed to the second memory state and a current flowing through the reference memory cell may be compared. Programming the multi-bit memory cell transistor to the second program state may then be verified responsive to comparing the currents flowing through the multi-bit memory cell and the reference memory cell.

19 Claims, 4 Drawing Sheets

METHODS OF PROGRAM-VERIFYING A MULTI-BIT NONVOLATILE MEMORY DEVICE AND CIRCUIT THEREOF

RELATED APPLICATION

This application claims the benefit of priority from Korean Patent Application No. 2004-103528, filed on Dec. 9, 2004, the disclosure of which is hereby incorporated herein by reference in its entirety.

FIELD OF THE INVENTION

This invention generally relates to non-volatile memory devices and, more specifically, to program verify methods for non-volatile memory devices.

BACKGROUND OF THE INVENTION

A non-volatile memory device may retain its stored data even when its power supply is interrupted. Types of non-volatile memory devices include PROM (Programmable Read Only Memory), EPROM (Erasable PROM), EEPROM (Electrically Erasable PROM), and Flash Memory. These non-volatile memory devices may be further classified into two groups: a NAND-type flash memory and a NOR-type flash memory. A NOR-type flash memory device may be used as a code storage memory device in applications of mobile cellular phones requiring fast data processing.

A NOR-type flash memory device may have a memory cell including source/drain regions doped with N+ impurities formed on a P-type semiconductor substrate with a channel region therebetween. The flash memory cell may also have a floating gate and a control gate. The floating gate may be formed on the channel region with a relatively thin insulating layer of 100 Å (Angstroms) or less between the floating gate and the channel region. The control gate may be formed on the floating gate with an insulating layer between the floating gate and the control gate. A bias voltage may be applied to a source, a drain, a gate, and a substrate of a memory cell during programming, erasing, and/or reading. To read data from the programmed cell, for example, a voltage of about 1V (volt) is applied to the drain, a power source voltage (e.g., about 4.5V) is applied to the control gate, a voltage of 0V is applied to the source, and a voltage of 0V is applied to the substrate.

The NOR-type flash memory device may provide a relatively large memory capacity in a relatively small area. To improve memory capacity, integration densities may need to be improved. Industry demands for more efficient integration density in flash memories and for expanded memory capacity have led to the development of multi-bit (also known as multi-level, multi-state, and/or multiple bit) technologies. A memory cell used to store multi-bit data may be referred to as a MLC (Multilevel Cell) or a multi-bit cell. For example, a programmed memory cell may store one of four data states, (i.e., "00", "01", "10", and "11") according to a distribution of a threshold voltage. The four states may be classified according to differences in the current flowing through the memory cell during read operations.

To sense multi-bit data stored in the memory cell, sense amplification may be used. Sense amplification is used to sense and amplify a difference of a current flowing through the memory cell and a reference current, and to thereby sense the multi-bit data stored in the memory cell. For this, a multiplicity of reference memory cells may be required. In addition, sense amplification may require circuits capable of providing different currents.

A conventional sense amplification may provide different current paths for different reference currents. A sense amplification, for example, may use three NMOS transistors to sense 2-bit data. The NMOS transistors may be connected in parallel with respect to each other to provide different current paths.

It may be difficult, however, to provide that the current paths have a same characteristic (e.g., the same threshold voltage). A sensing margin may be reduced due to a mismatch between different current paths. In a conventional flash memory device, for example, a NMOS transistor used to sense data during read operations may be different from a NMOS transistor used to sense data during program verify operations. In this case, a sensing margin may be reduced because a current path is changed despite sensing data of a same state. As a result, exact sensing may be difficult to perform, and sensing results may vary.

Additionally, there may be a disadvantage of a long program verify time because the program verify operation of the conventional NOR-type flash memory device is performed via verify steps twice irrespective of the memory cell state. When the "01" state is program-verified, for example, the "01" state as well as the "00" state may also be program-verified. When the "10" state is program-verified, the "01" state may be program-verified, and then the "10" state may be program-verified again. Performing the program verify step twice may undesirably increase a program verify time.

SUMMARY

According to some embodiments of the present invention, methods may be provided to verify a program state of a non-volatile memory device including a multi-bit memory cell transistor providing more than two different program states. More particularly, the multi-bit memory cell transistor may be programmed from a first program state to a second program state, and a reference memory cell corresponding to the second program state may be selected. After programming the multi-bit memory cell transistor to the second program state and after selecting the reference memory cell corresponding to the second program state, a current flowing through the multi-bit memory cell transistor programmed to the second memory state and a current flowing through the reference memory cell may be compared. Programming the multi-bit memory cell transistor to the second program state may be verified responsive to comparing the currents flowing through the multi-bit memory cell and the reference memory cell.

The first program state, for example, may be an erase program state. More particularly, the erase program state may be a "11" program state, the second program state may be a "01" program state, and the reference memory cell may be a program verifying reference memory cell for the "01" program state.

The non-volatile memory device may be a NOR-type flash memory device. Moreover, comparing the currents flowing through the multi-bit memory cell and the reference memory cell may include determining a difference between the currents flowing through the multi-bit memory cell and the reference memory cell. Verifying programming the multi-bit memory cell transistor may include determining success or failure of programming the multi-bit memory cell to the second program state.

According to additional embodiments of the present invention, methods may be provided to verify a program state of a non-volatile memory device including a multi-bit memory cell transistor providing more than two different program states. The multi-bit memory cell transistor may be programmed from a first program state to a second program state, and a first reference memory cell corresponding to an upper data bit of the second program state may be selected.

A current flowing through the multi-bit memory cell transistor programmed to the second memory state and a current flowing through the first reference memory cell corresponding to the upper data bit of the second programming state may be compared, and the upper data bit of the second program state may be sensed responsive to comparing the currents flowing through the multi-bit memory cell transistor and the first reference memory cell. After sending the upper data bit of the second program state, a second reference memory cell corresponding to a lower bit of the second program state may be selected, and a current flowing through the multi-bit memory cell transistor programmed to the second memory state and a current flowing through the second reference memory cell corresponding to the lower bit of the second program state may be compared. Programming the multi-bit memory cell transistor to the second program state may be verified responsive to comparing the currents flowing through the multi-bit memory cell and the second reference memory cell.

The first program state may be an erase program state. More particularly, the erase program state may be a "11" program state, the second program state may be a "10" state, the first reference memory cell may be a reference memory cell to verify a "01" program state, and the second reference memory cell may be a reference memory cell to verify the "10" program state. In an alternative embodiment, the erase program state may be a "11" program state, the second program state may be a "00" program state, the first reference memory cell may be a reference memory cell to verify a "01" program state, and the second reference memory cell may be a reference memory cell to verify the "00" program state. In another alternative embodiment, the erase program state may be a "11" program state, the second program state may be a "00" program state, the first reference memory cell may be a reference memory cell to verify the "11" program state, and the second reference memory cell may be a reference memory cell to verify the "00" program state.

The non-volatile memory device may be a NOR-type flash memory device. In addition, verifying programming the multi-bit memory cell transistor may include determining success or failure of programming the multi-bit memory cell to the second program state.

According to some embodiments of the present invention, a program verify method of a non-volatile memory device may be capable of improving a mismatch during reading and program verify operations, and at the same time, reducing a program verify time.

According to some additional embodiments of the present invention, a program verify method of a non-volatile memory device may be provided wherein a memory cell has a multi-state according to a distribution of a threshold voltage. The method may include programming a memory cell from an erase state to one of the multi-state. A reference memory cell corresponding to the one state may be selected. A current flowing through the programmed memory cell may be compared with a current flowing through the reference memory cell. Whether the programmed cell passes or fails may be determined based on the comparison.

The erase state may be the "11" state, the one state may be the "01" state, and the reference memory cell may be a memory cell used to program-verify the "01" state. The non-volatile memory device may be a NOR-type flash memory device.

According to some more embodiments of the present invention, a program verify method of a non-volatile memory device may be provided wherein a memory cell has a multi-state according to a distribution of a threshold voltage. The method may include programming a memory cell from an erase state to a predetermined state and a first reference memory cell corresponding to upper bit data of the predetermined state may be selected. A current flowing through the programmed memory cell may be compared with a current flowing through the reference memory cell to sense the upper bit data of the predetermined state. The upper bit data of the predetermined state may be sensed, and a second reference memory cell corresponding to lower bit data of the predetermined state may then be selected. A current flowing the programmed memory cell may be compared with a current flowing through the second reference memory cell. Whether the programmed cell passes or fails may be determined based on the comparison.

The erase state may be the "11" state, the predetermined state may be the "10" state, the first reference memory cell may be a memory cell used to program-verify the "01" state, and the second reference memory cell may be a memory cell used to program-verify the "10" state. The erase state may be the "11" state, the predetermined state may be the "00" state, the first reference memory cell may be a memory cell used to program-verify the "01" state, and the second reference memory cell may be a memory cell used to program-verify the "00" state. The erase state may be the "11" state, the predetermined state may be the "00" state, the first reference memory cell may be a memory cell used to program-verify the "11" state, and the second reference memory cell may be a memory used to program-verify the "00" state. The non-volatile memory device may be a NOR-type memory device.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough- and complete, and will fully convey the scope of the invention to those skilled in the art.

It will also be understood that when an element is referred to as being connected and/or coupled to/with another element, it can be directly connected and/or coupled to/with the other element or intervening elements may also be present. In contrast, if an element is referred to as being directly connected and/or coupled to/with another element, then no other intervening elements are present. As used herein, the term and/or includes any and all combinations of one or more of the associated listed items.

It will be understood that although the terms first and second are used herein to describe various elements, these elements should not be limited by these terms. These terms are only used to distinguish one element from another element. Thus, a first element discussed below could be termed a second element, and similarly, a second element could be termed a first element without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
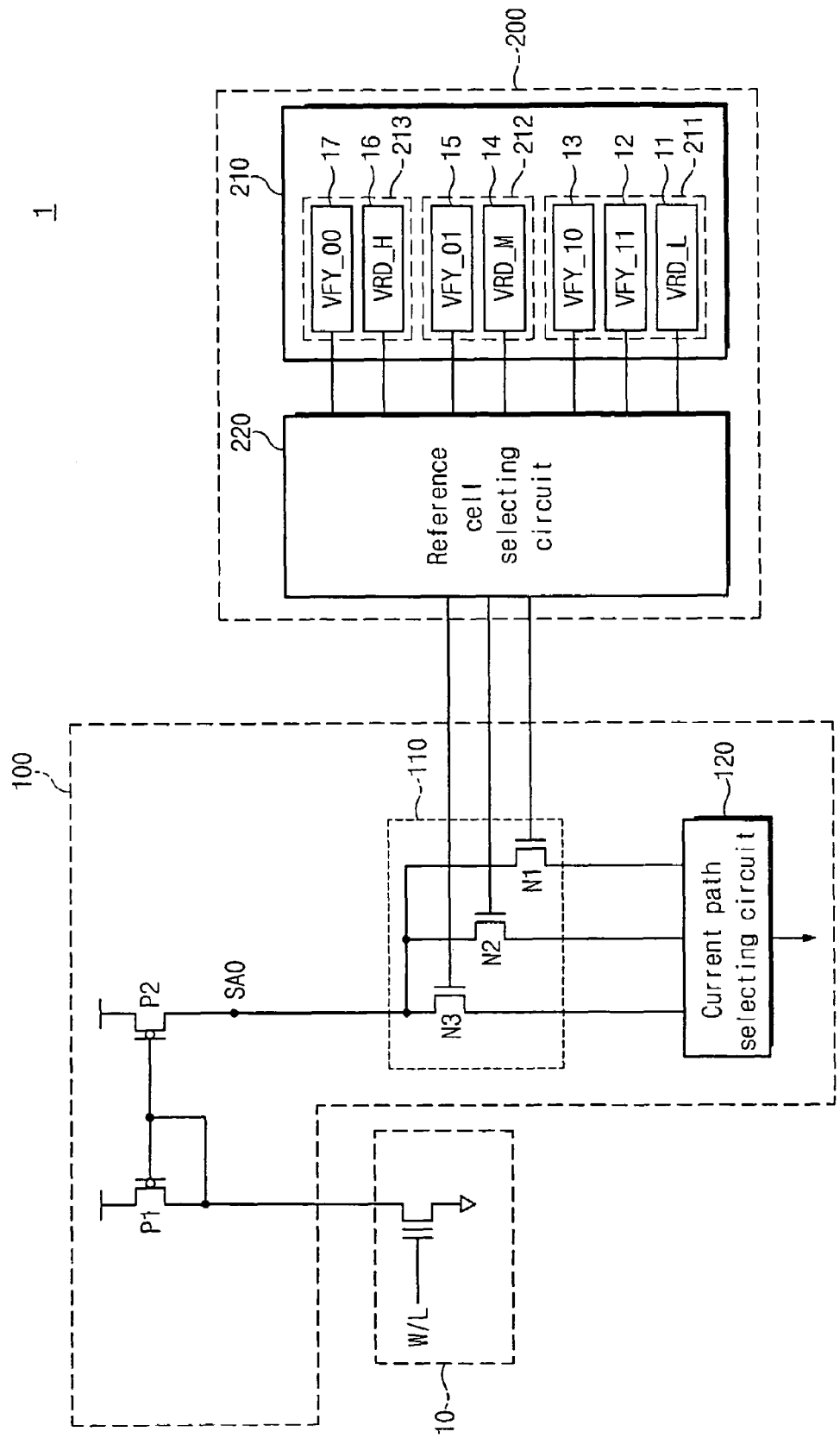
FIG. 1 is a block diagram of a NOR-type flash memory device illustrating program verify methods according to embodiments of the present invention.

FIG. 1 is a block diagram of a NOR-type flash memory device illustrating structures providing program verification according to embodiments of the present invention. Referring to FIG. 1, the NOR-type flash memory device 1 may include a memory cell 10, a sense amplification circuit 100, and a reference current copy circuit 200.

The memory cell 10 has multiple programming states according to a distribution of a threshold voltage. For example, the memory cell 10 may have four programming states e.g., "00", "01", "10", and "11". In this case, a first data bit data may be defined as an upper data bit, and a second data bit may be defined as lower data bit. The programmed states according to the distribution of the threshold voltage of the memory cell 10 will be further discussed with reference to FIG. 2.

The sense amplification circuit 100 senses and amplifies a difference between a current flowing through the memory cell 10 and a reference current. The sense amplification circuit 100 includes a current path generating circuit 110, a current path selecting circuit 120, and PMOS transistors P1 and P2 to provide a current mirror.

The current path generating circuit 110 is electrically connected between a sensing node SA0 and the current path selecting circuit 120. The current path generating circuit 110 may include three NMOS transistors N1, N2, and N3, which are connected in parallel. The NMOS transistors N1, N2, and N3 may provide a current path between the sensing node SA0 and a reference voltage such as ground. A reference current flows in the current path of the NMOS transistors N1, N2, and/or N3. The reference current flowing through the NMOS transistors N1, N2, and/or N3 may be copied from a current flowing through the reference current copy circuit 200.

The current path selecting circuit 120 is electrically connected between the current path generating circuit 110 and a reference voltage such as ground. One current path among current paths of the current path generating circuit 110 is selected. In other words, one of the NMOS transistors N1, N2, or N3 is selected, and a reference current flows through the selected NMOS transistor.

Referring still to FIG. 1, the reference current copy circuit 200 includes a reference current generating circuit 210 and a reference cell selecting circuit 220. A reference current is copied to the current path generating circuit 110 by the reference current copy circuit 200. The reference current generating circuit 210 includes reference memory cells 11-17. The reference memory cells are classified into three groups.

The reference memory cells of the first group 211 may include a reference memory cell 11 used to read a lower data bit, a reference memory cell 12 used to erase verify the "11"-state, and a reference memory cell 13 used to program-verify the "10" state. The threshold voltage of the reference memory cells 11, 12, and 13 is VRD_L, VFY_11, and VFY_10, respectively. The reference current generated from a selected one of the reference memory cells of the first group 211 may be copied to the NMOS transistor N1 of the current path generating circuit 110.

The reference memory cells of the second group 212 may include a reference memory cell 14 used to read an upper data bit and a reference memory cell 15 used to program-verify the "01" state. The threshold voltages of the reference memory cells 14 and 15 are VRD_M and VFY_01, respectively. The reference current generated from a selected one of the reference memory cells of the second group 212 may be copied to the NMOS transistor N2 of the current path generating circuit 110.

The reference memory cells of the third group 213 may include a reference memory cell 16 used to read a lower data bit and a reference memory cell 17 used to program-verify the "00" state. The threshold voltages of the reference memory cells 16 and 17 are VRD_H and VFY_00, respectively. The reference current generated from a selected one of the reference memory cells of the third group 213 may be copied to the NMOS transistor N3 of the current path generating circuit 110.

One reference memory cell among the reference memory cells 11-17 is selected according to an operation mode of the reference cell selecting circuit 220. For example, a sensing operation may be required two times to read the programmed cell of the "00" state. During a first sensing operation, the first reference memory cell 15 is selected, and during a second sensing operation, the second reference memory cell 16 is selected. The reference current flowing through the selected memory cell flows through a relevant NMOS transistor of the current path generating circuit 110.

In a conventional program-verify method, a mismatch may occur because a current path determining whether the programmed cell passes/fails during a program-verifying operation is different from a current path used to sense a state of the memory cell during a read operation. If there is a mismatch, the sensing margin of the sense amplification circuit may be dramatically reduced. Assuming that the memory cell 10 is programmed in "10" state, for example, a current path used to determine whether the programmed cell passes/fails during the program-verifying operation is the NMOS transistor N1, and a current path used to determine the "10" state during the reading operation is the NMOS transistor N2. Under this condition, a mismatch may occur due to varied current paths used to sense the memory cell 10 that is in the "10" state.

In program-verifying methods according to embodiments of the present invention, mismatch may be reduced by coinciding a current path used to determine whether the programmed cell passes/fails during the program-verifying operation with a current path used to determine a state of the memory cell during the reading operation.

Figure 2:
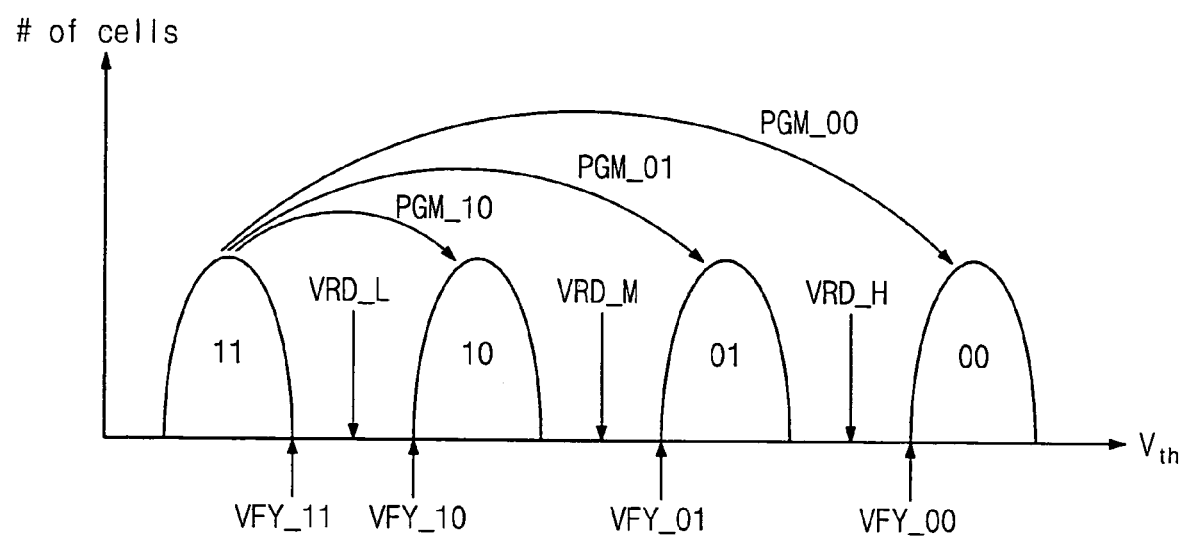
FIG. 2 is a state diagram of a memory cell having a multi-state according to a distribution of a threshold voltage according to embodiments of the present invention.

FIG. 2 is a state diagram showing that the memory cell of FIG. 1 provides multiple memory states according to a distribution of a threshold voltage. The memory cell 10 may have one of four memory states, e.g., "11", "10", "01", and "00" according to a threshold voltage Vth. Referring to FIG. 2, the memory cell 10 may be programmed to one of the respective states, e.g., "10", "10", and "00" from the erase state "11". That is, the memory cell in the erase state ("11" state) may be programmed to the "01" state using a second program operation PGM_01. The memory cell in the erase state ("11" state) may be programmed to the "00" state using a third program operation PGM_00.

In addition, FIG. 2 shows threshold voltages of the reference memory cells of FIG. 1. The threshold voltage of the reference memory cell 12 for erase verifying is VFY_11. The threshold voltages of the reference memory cells 13, 15, and 17 for program-verifying are VFY_10, VFY_01, and VFY_00, respectively. The threshold voltages of the reference memory cells 11, 14, and 16 for reading data stored in the memory cell 10 is VRD_L, VRD_M, and VRD_H, respectively.

Figure 3:
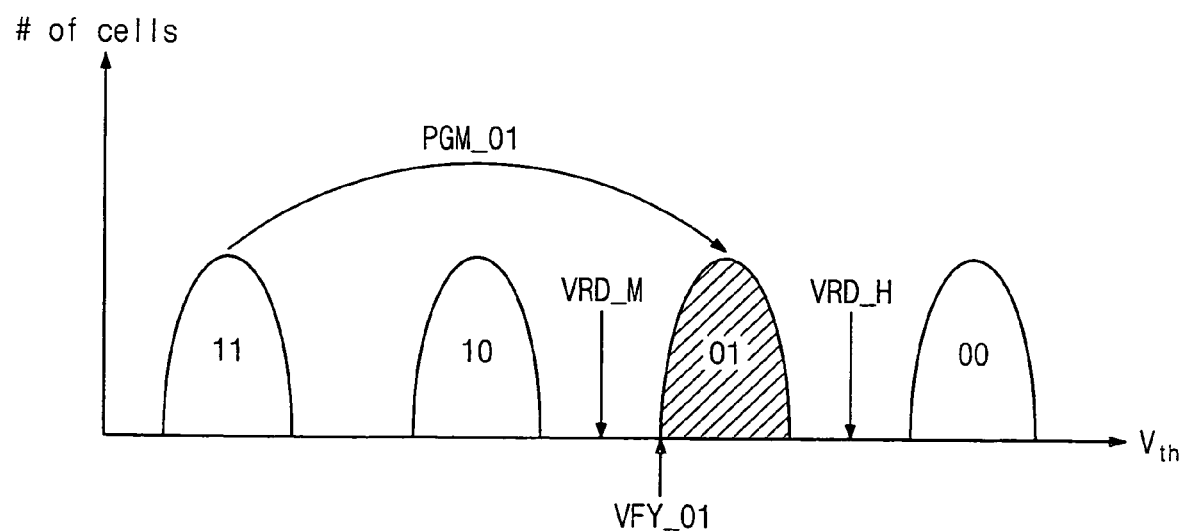
FIGS. 3 to 6 are state diagrams illustrating program verify methods according to embodiments of the present invention.
Figure 6:
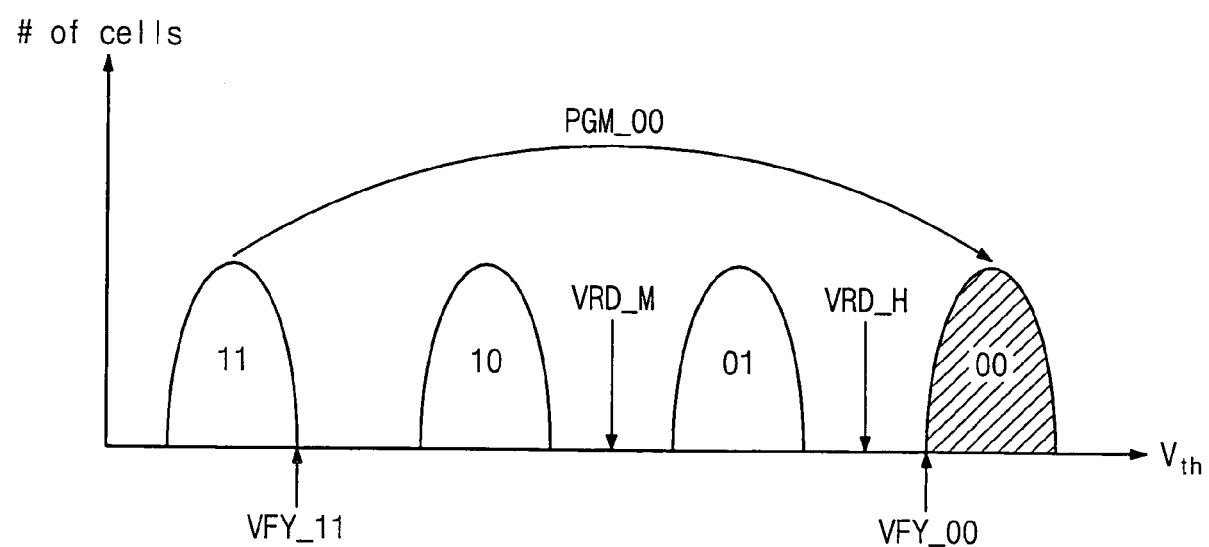

FIG. 3 shows a program-verifying method of a NOR-type flash memory device according to some embodiments of the present invention of FIG. 6. Also, FIG. 3 is a state diagram illustrating a program-verifying method of a memory cell that is programmed in the "01" state.

The memory cell 10 in the erase state ("11" state) is programmed to the "01" state using the program operation PGM_01. After the program operation PGM_01, the reference memory cell 15 is selected to verify whether the memory cell 10 is normally programmed to the "01" state. The reference memory cell 15 has a threshold voltage of VFY_01. The current flowing through the reference memory cell 15 is copied to the NMOS transistor N2 of the current path generating circuit 110. The current path selecting circuit 120 provides a current path between a sensing node SA0 and a reference voltage such as ground through the NMOS transistor N2.

Next, the sense amplification circuit 100 compares a current flowing through the memory cell 10 with a current flowing through the NMOS transistor N2 and then determines whether the programmed cell passes/fails on the basis that the programmed memory cell 10 is in the "01" state.

In the meanwhile, a sensing operation may be performed two times to read 2-bit data 01 stored in the memory cell 10. The upper data bit may be sensed using the first sensing operation, and a lower data bit may be sensed according to the upper data bit by the second sensing operation.

During the first sensing operation, a reference memory cell 14 is selected. The threshold voltage of the reference memory cell 14 is VRD_M. The current flowing through the reference memory cell 14 is copied to the NMOS transistor N2 of the current path generating circuit 110. The sense amplification circuit 100 compares the current flowing through the memory cell 10 with the current flowing through the NMOS transistor N2 to output upper data bit "0".

During the second sensing operation, a reference memory cell 16 is selected to output lower data bit according to the upper bit data. The threshold voltage of the reference memory cell 16 is VRD_H. The current flowing through the reference memory cell 16 is copied to the NMOS transistor N3 of the current path generating circuit 110. The sense amplification circuit 100 compares the current flowing through the memory cell 10 with the current flowing through the NMOS transistor N3 to output lower data bit "1".

In a conventional program-verifying method, a verifying operation is performed at two times in the same manner as the sensing operation of two times during the reading operation. During the first verifying operation, the reference memory cell 15 is selected to determine whether the programmed cell passes/fails. During the second verifying operation, the reference memory cell 17 is selected to determine whether the programmed cell passes/fails. In this case, the threshold voltages of the reference memory cells 15 and 17 are VFY_01 and VFY_00, respectively.

In program-verifying operation according to embodiments of the present invention, the program-verifying operation is performed at only one time. Whether the programmed cell passes/fails during the program-verifying operation is determined by the first verifying operation. In program-verifying operations according to embodiments of the present invention, the second verifying operation may be omitted, and a program-verifying time may be reduced by about half. Referring still to FIG. 1, a mismatch may be reduced because the current path determining whether the programmed cell passes/fails during the program-verifying operation is the same as the current path determining a state of the memory cell during the reading operation.

Figure 4:
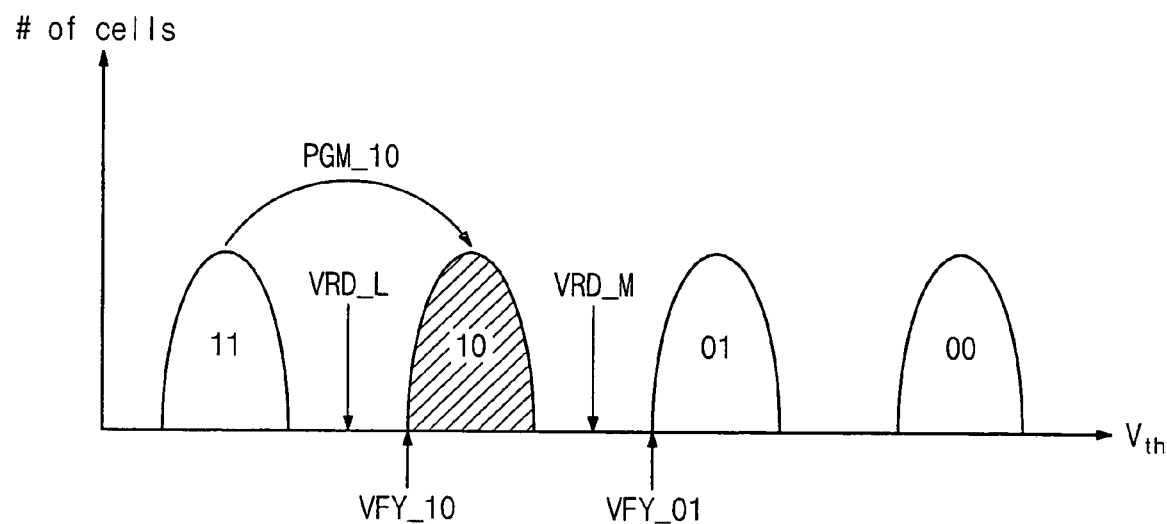

FIG. 4 is a state diagram illustrating a program verify method of the programmed memory cell of the "10" state. Referring to FIG. 4, the memory cell 10 in the erase state ("11" state) is programmed to the "10" state by the program operation PGM_10. After the program operation PGM_10, a program-verifying operation is performed to verify whether the memory cell 10 is programmed to the "10". In FIG. 4, whether the memory cell 10 passes/fails is determined by the reference memory cell 13. The threshold voltage of the reference memory cell 13 is VFY_10.

In advance, the reference memory cell 15 is selected. The threshold voltage of the reference memory cell 15 is VFY_01. The reference memory cell 15 is to be sensed in the same manner as the reading operation. In a serial sensing operation wherein 2-bit data is sequentially sensed, a first sensing operation is performed using the NMOS transistor N2 of the current path generating circuit 110. The second sensing operation is performed using the NMOS transistor (N1 or N3) according to the result of the first sensing operation. Similarly, in the program-verifying operation, the sensing operation may be performed through the NMOS transistor N2 by selecting the reference memory cell 15. However, the sensing operation by the reference memory cell 15 is not a verifying operation used to determine whether the memory cell 10 passes/fails. Accordingly, it may be enough to perform the sensing operation faster than the verifying operation.

Next, the second reference memory cell 13 is selected. The second reference memory cell 13 has a threshold voltage of VFY_10. The current flowing through the second reference memory cell 13 is copied to the NMOS transistor N1 of the current path generating circuit 110. The current path selecting circuit 120 provides a current path between the sensing node SA0 and a reference voltage such as ground through the NMOS transistor N1. The sense amplification circuit 100 compares the memory cell 10 with the NMOS transistor N1 to determine whether the memory cell 10 passes/fails.

The sensing operation may be performed at two times to read 2-bit data stored in the memory cell 10. During the first sensing operation, the first reference memory cell 14 is selected. The threshold voltage of the first reference memory cell 14 is VRD_M. The current flowing the first reference memory cell 14 is copied to the NMOS transistor N2 of the current path generating circuit 110. During the second sensing operation, the second reference memory cell 11 is selected. The threshold voltage of the first reference memory cell 11 is VRD_L. The current flowing through the first reference memory cell 11 is copied to the NMOS transistor N1 of the current path generating circuit 110.

In program verify methods according to embodiments of the present invention, the program-verifying operation may be performed at one time. Since it takes a relatively short time for operations of selecting and sensing the reference memory cell 15 to be performed as compared with the program-verifying operation, a time for program-verifying operations may be reduced. In addition, in program-verifying operations according to embodiments of the present invention, a mismatch can be reduced because a current path N1 used to determine whether the programmed cell passes/fails during the program-verifying operation may be the same as a current path N1 used to determine a state of the memory cell during the reading operation.

Figure 5:
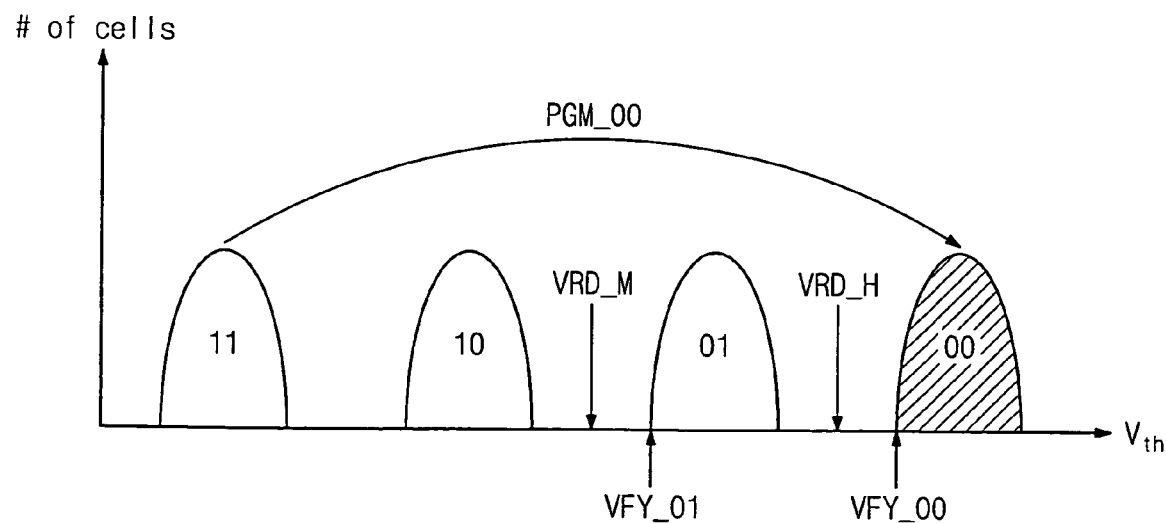

FIG. 5 is a state diagram illustrating the program verify method of the memory cell to be programmed in the "00" state. The memory cell 10 in the erase state ("11" state) is programmed to the "00" state by the program operation PGM_00. After the program operation PGM_00, a program-verifying operation used to verify whether the memory cell 10 is programmed to "00" state is performed. In FIG. 5, the reference memory cell 17 determines whether the memory cell 10 passes/fails. The threshold voltage of the reference memory cell 17 is VFY_00.

In advance, the first reference memory cell 15 is selected. The first reference memory cell 15 is selected and sensed to be sensed in the same manner as the reading operation. Then, the second reference memory cell 17 is selected. The threshold voltage of the reference memory cell 17 is VFY_00. The current flowing through the second reference memory cell 17 is copied to the NMOS transistor N3 of the current path generating circuit 10. The sense amplification circuit 100 compares a current flowing through the memory cell 10 and a current flowing through the NMOS transistor N3 to determine whether the memory cell 10 passes/fails.

The sensing operation is performed at two times to read 2-bit data stored in the memory cell 10. During the first sensing operation, the first reference memory cell 14 is selected. The threshold voltage of the first reference memory cell 14 is VRD_M. The current flowing through the first reference memory cell 14 is copied to the NMOS transistor N2. During the second sensing operation, the second reference memory cell 16 is selected. The threshold voltage of the second reference memory cell 16 is VRD_H. The current flowing through the second reference memory cell 16 is copied to the NMOS transistor N3 of the current path generating circuit 110.

In program-verifying operations according to embodiments of the present invention, as shown in FIG. 5, operations for selecting and sensing the reference memory cell are performed at one time, and a program-verifying operation is performed at one time. Thus, a program-verifying time can be reduced, and a mismatch may also be improved.

FIG. 6 is a state diagram illustrating another embodiment of the memory cell that is programmed to the "00" state. Unlike the program-verifying operation of FIG. 5, the program-verifying operation of FIG. 6 selects the first reference memory cell 12 having a threshold voltage of VFY_00 state. The reason for selecting the first reference memory cell 12 is to reduce a time for sensing a difference of the current flowing through the memory cell 10 and the current flowing through the first reference memory cell 12. Therefore, in the program-verifying operation of FIG. 6, a duration of a program-verifying operation may be further reduced.

According to the program verify method of the non-volatile memory device, a sufficient verify time may be secured only in the step used to determine whether the programmed cell passes/fails. However, a step of sensing whether the programmed cell passes/fails may be omitted, or the time thereof may be reduced. Consequently, a program-verifying time may be reduced. Also, a mismatch can be reduced by coinciding a current path used to determine a state of the memory cell during the reading operation and a current path used to determine whether the programmed cell passes/fails during the program-verifying operation.

According to embodiments of the present invention, in program verify methods of non-volatile memory devices, a program-verifying time can be reduced, and a mismatch in a current path generating circuit may be reduced.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of verifying a program state of a non-volatile memory device including a multi-bit memory cell transistor providing more than two different program states, the method including:
    programming the multi-bit memory cell transistor from a first program state to a second program state;
    selecting one of a plurality of reference memory cells wherein the selected reference memory cell corresponds to the second program state;
    after programming the multi-bit memory cell transistor to the second program state and after selecting the reference memory cell corresponding to the second program state, copying a reference current defined by the selected reference memory cell at a selected one of a plurality of current path generating transistors electrically connected in parallel wherein the reference current passes through the selected current path generating transistor without passing through the selected reference memory cell;
    comparing a current flowing through the multi-bit memory cell transistor programmed to the second memory state and the reference current flowing through the selected current path generating transistor; and
    verifying programmning the multi-bit memory cell transistor to the second program state responsive to comparing the currents flowing through the multi-bit memory cell and the selected current path generating transistor; and
    after verifying programming the multi-bit memory cell transistor, reading a program state of the multi-bit memory cell transistor wherein a current path of the reference current flowing through the selected current path generating transistor used to verify programming of the multi-bit memory cell transistor coincides with a current path used to read the program state of the multi-bit memory cell transistor.

2. A method according to claim 1 wherein the first program state comprises an erase program state.

3. A method according to claim 2 wherein the erase program state is a "11" program state, wherein the second program state is a "01" program state, and wherein the reference memory cell is a program verifying reference memory cell for the "01" program state.

4. A method according to claim 1 wherein the non-volatile memory device comprises a NOR-type flash memory device.

5. A method according to claim 1 wherein comparing the currents flowing through the multi-bit memory cell and the selected current path generating transistor comprises determining whether a difference between the currents flowing through the multi-bit memory cell and the selected current path generating transistor exceeds a threshold.

6. A method according to claim 1 wherein verifying programming the multi-bit memory cell transistor comprises determining success or failure of programming the multi-bit memory cell to the second program state.

7. A method of determining a program state of a non-volatile memory device including a multi-bit memory cell transistor providing more than two different program states, the method including:
   programming the multi-bit memory cell transistor from a first program state to a second program state;
   selecting a first reference memory cell corresponding to a first data bit;
   comparing a current flowing through the multi-bit memory cell transistor programmed to the second memory state and a first reference current defined by the first reference memory cell corresponding to the first data bit;
   sensing a value of the first data bit of the second program state responsive to comparing the current flowing through the multi-bit memory cell transistor and the first reference current defined by the first reference memory cell;
   after sensing the first data bit of the second program state, selecting one of a plurality of second reference memory cells wherein the second selected reference memory cell corresponds to a second bit based on sensing the first data bit;
   comparing a current flowing through the multi-bit memory cell transistor programmed to the second memory state and a second current defined by the selected second reference memory cell corresponding to the second bit; and
   sensing a value of the second data bit of the second program state responsive to comparing the current flowing through the multi-bit memory cell transistor and the second reference current defined by the selected reference memory cell;
   wherein a current path of the second reference current defined by the selected reference memory cell is used to verify programming of the multi-bit memory cell transistor after programming thereof and to read a programmed state of the multi-bit memory cell transistor during a read operation.

8. A method according to claim 7 wherein the first program state comprises an erase program state.

9. A method according to claim 8 wherein the erase program state is a "11" program state, wherein the second program state is a "10" state, wherein the first reference memory cell is a reference memory cell to verify a "01" program state, and wherein the second reference memory cell is a reference memory cell to verify the "10" program state.

10. A method according to claim 8 wherein the erase program state is a "11" program state, wherein the second program state is a "00" program state, wherein the first reference memory cell is a reference memory cell to verify a "01" program state, and wherein the second reference memory cell is a reference memory cell to verify the "00" program state.

11. A method according to claim 8 wherein the erase program state is a "11" program state, wherein the second program state is a "00" program state, wherein the first reference memory cell is a reference memory cell to verify the "11" program state, and wherein the second reference memory cell is a reference memory cell to verify the "00" program state.

12. A method according to claim 7 wherein the non-volatile memory device comprises a NOR-type flash memory device.

13. A method according to claim 7 further comprising:
   determining success or failure of programming the multi-bit memory cell to the second program state based on sensing values of the first and second data bits.

14. A method according to claim 7 wherein the first data bit comprises an upper data bit and wherein the second data bit comprises a lower data bit.

15. A non-volatile memory device comprising:
   a memory cell programmable to at least four different states including a first programmable state, a second programmable state, a third programmable state, and a fourth programmable state;
   a sense amplification circuit configured to be coupled to the memory cell wherein the sense amplification circuit includes a reference current generating circuit and wherein the sense amplification circuit is configured to compare a current through the memory cell and a reference current through the reference current generating circuit;
   first, second, third, and fourth verify reference memory cells corresponding to the respective first, second, third, and fourth programmable states of the memory cell wherein a first verify threshold voltage of the first verify reference memory cell is less than a second verify threshold voltage of the second verify reference memory cell, wherein the second verify threshold voltage of the second verify reference memory cell is less than a third verify threshold voltage of the third verify reference memory cell, and wherein the third verify threshold voltage of the third program-verify reference memory cell is less than a fourth threshold voltage of the fourth program-verify reference memory cell; and
   a reference cell selecting circuit coupled to the reference current generating circuit so that a reference current through the reference current generating circuit is defined by a respective one of the verify reference memory cells corresponding to the respective programmable state to which the memory cell is being programmed, and wherein the sense amplifier is configured to compare the reference current and a current through the memory cell to verify programming thereof wherein the reference current passes through the reference current generating circuit without passing through any of the first, second, third, and/or fourth verify reference memory cells wherein a current path of the reference current through the reference current generating circuit used to verify programming the memory cell coincides with a current path used to read a program state of the memory cell.

16. A non-volatile memory device according to claim 15 wherein the reference current generating circuit includes first, second, and third current generating transistors, and wherein the reference cell selecting circuit and the sense amplification circuit are configured to generate the reference current defined by the second verify reference memory cell through the first current generating transistor to verify programming of the memory cell to the second programmable state, to generate the reference current defined by the third verify reference memory cell through the second current generating transistor to verify programming of the memory cell to the third programmable state, and to generate the reference current defined by the fourth verify reference memory cell through the third current generating transistor to verify programming of the memory cell to the fourth programmable state.

17. A non-volatile memory device according to claim 16 further comprising:
first, second, and third read reference memory cells wherein a first read threshold voltage of the first read reference memory cell is greater than the first verify threshold voltage and less than the second verify threshold voltage, wherein a second read threshold voltage of the second read reference memory cell is greater than the second verify threshold voltage and less than the third verify threshold voltage, and wherein a third read threshold voltage of the third read reference memory cell is greater than the first verify threshold voltage and less than the second verify threshold voltage, so that a reference current through the reference current generating circuit is defined by respective ones of the read reference memory cells during a read operation, and wherein the sense amplifier is configured to compare the reference current and a current through the memory cell to read data from the memory cell during the read operation.

18. A non-volatile memory device according to claim 17 wherein the reference cell selecting circuit is configured during the read operation to first define the reference current through the reference current generating circuit corresponding to the second read reference memory cell so that the sense amplification circuit determines a first bit stored in the memory cell, and then based on determining the first bit stored, the reference cell selecting circuit is configured to define the reference current through the reference current generating circuit corresponding to the first read reference memory cell or corresponding to the third read reference memory cell so that the sense amplification circuit determines a second bit stored in the memory cell.

19. A non-volatile memory device according to claim 17 wherein the reference cell selecting circuit is configured to define the reference current through the reference current generating circuit during the read operation by generating a reference current through the first current generating transistor corresponding to a current defined by the first read reference memory cell, by generating a reference current through the second current generating transistor corresponding to a current defined by the second read reference memory cell, or by generating a reference current through the third current generating transistor corresponding to a current defined by the third read reference memory cell.

* * * * *